United States Patent
Toyoda et al.

(10) Patent No.: US 9,761,472 B2
(45) Date of Patent: Sep. 12, 2017

(54) CONTAINER OPENING/CLOSING DEVICE

(71) Applicant: Hirata Corporation, Shinagawa-ku, Tokyo (JP)

(72) Inventors: Noriyoshi Toyoda, Tokyo (JP); Hirofumi Nakamura, Tokyo (JP)

(73) Assignee: HIRATA CORPORATION, Shinagawa-ku, Tokyo (JP)

( * ) Notice: Subject to any disclaimer, the term of this patent is extended or adjusted under 35 U.S.C. 154(b) by 174 days.

(21) Appl. No.: 14/924,259

(22) Filed: Oct. 27, 2015

(65) Prior Publication Data

US 2016/0049322 A1 Feb. 18, 2016

Related U.S. Application Data

(60) Division of application No. 14/143,307, filed on Dec. 30, 2013, now Pat. No. 9,324,599, which is a (Continued)

(30) Foreign Application Priority Data

Jul. 6, 2011 (JP) ................................. 2011-150328

(51) Int. Cl.
*H01L 21/677* (2006.01)
*E05F 15/60* (2015.01)
(Continued)

(52) U.S. Cl.
CPC ........ *H01L 21/67772* (2013.01); *E05F 15/60* (2015.01); *E05F 15/70* (2015.01);
(Continued)

(58) Field of Classification Search
CPC ......... H01L 21/67772; H01L 21/67775; H01L 21/67763; H01L 21/67778; H01L 21/67766; H01L 21/67373; E05C 19/007
See application file for complete search history.

(56) References Cited

U.S. PATENT DOCUMENTS 6,106,213 A    8/2000   Denker
6,470,927 B2   10/2002   Otaguro
(Continued)

FOREIGN PATENT DOCUMENTS

JP          05-109863 A      4/1993
JP    DE 19938142 A1 *   2/2000        H01L 21/67373
(Continued)

OTHER PUBLICATIONS

International Search Report (PCT/ISA/210) mailed on Jun. 12, 2012, by the Japanese Patent Office as the International Searching Authority for International Application No. PCT/JP2012/003107.
(Continued)

*Primary Examiner* — Glenn Myers
(74) *Attorney, Agent, or Firm* — Buchanan Ingersoll & Rooney PC

(57) ABSTRACT

The present invention provides a container opening/closing device for opening and closing a lid of a container. The container comprises a container body including an opening and the lid detachably attached to the opening. The device comprises an opening/closing mechanism including a holding portion for holding the lid and a pressing mechanism. The opening/closing mechanism opens and closes the opening by moving the holding portion between a closing position and an open position. The pressing mechanism presses a peripheral edge of the holding portion toward the container body when the opening/closing mechanism moves the lid from the open position to the closing position.

3 Claims, 14 Drawing Sheets

Related U.S. Application Data continuation of application No. PCT/JP2012/003107, filed on May 11, 2012.

(51) Int. Cl.
*E05F 15/70* (2015.01)
*E05C 19/00* (2006.01)
*H01L 21/673* (2006.01)

(52) U.S. Cl.
CPC ...... *H01L 21/67376* (2013.01); *E05C 19/007* (2013.01); *H01L 21/67373* (2013.01); *H01L 21/67775* (2013.01); *Y10T 29/53* (2015.01)

(56) References Cited

U.S. PATENT DOCUMENTS

| | | | |
|---|---|---|---|
| 7,568,875 | B2 | 8/2009 | Le Guet et al. |
| 8,540,473 | B2 | 9/2013 | Asa et al. |
| 2002/0106268 | A1 | 8/2002 | Ueda et al. |
| 2002/0179892 | A1* | 12/2002 | Saeki ................ H01L 21/67772 254/222 |
| 2007/0110548 | A1 | 5/2007 | Oyama et al. |
| 2008/0092769 | A1 | 4/2008 | Izumi et al. |
| 2008/0276685 | A1 | 11/2008 | Godot |
| 2009/0245981 | A1 | 10/2009 | Miyajima et al. |
| 2012/0000816 | A1 | 1/2012 | Bonora |

FOREIGN PATENT DOCUMENTS

| | | | |
|---|---|---|---|
| JP | 2000-174110 | A | 6/2000 |
| JP | 2002134602 | A * | 5/2002 |
| JP | 2002-184831 | A | 6/2002 |
| JP | 2003-168727 | A | 6/2003 |
| JP | 3103294 | U | 8/2004 |
| JP | 2005-026513 | A | 1/2005 |
| JP | 2006-074033 | A | 3/2006 |
| JP | 2008-100635 | A | 5/2008 |
| JP | 2009-200200 | A | 9/2009 |
| JP | 2009-239004 | A | 10/2009 |
| JP | 2010-034145 | A | 2/2010 |
| JP | 2012-038945 | A | 2/2012 |
| JP | 2013-539203 | A | 10/2013 |
| TW | 491803 | B | 6/2002 |

OTHER PUBLICATIONS

Written Opinion (PCT/ISA/237) mailed on Jun. 12, 2012, by the Japanese Patent Office as the International Searching Authority for International Application No. PCT/JP2012/003107.

Taiwan Office Action dated May 8, 2014 issued in corresponding Taiwan Patent Appln. No. 101119747 (4 pages).

Office Action issued on Sep. 19, 2014, by the Japanese Patent Office in corresponding Japanese Patent Application No. 2013-522697. (7 pages).

* cited by examiner

F I G. 5A
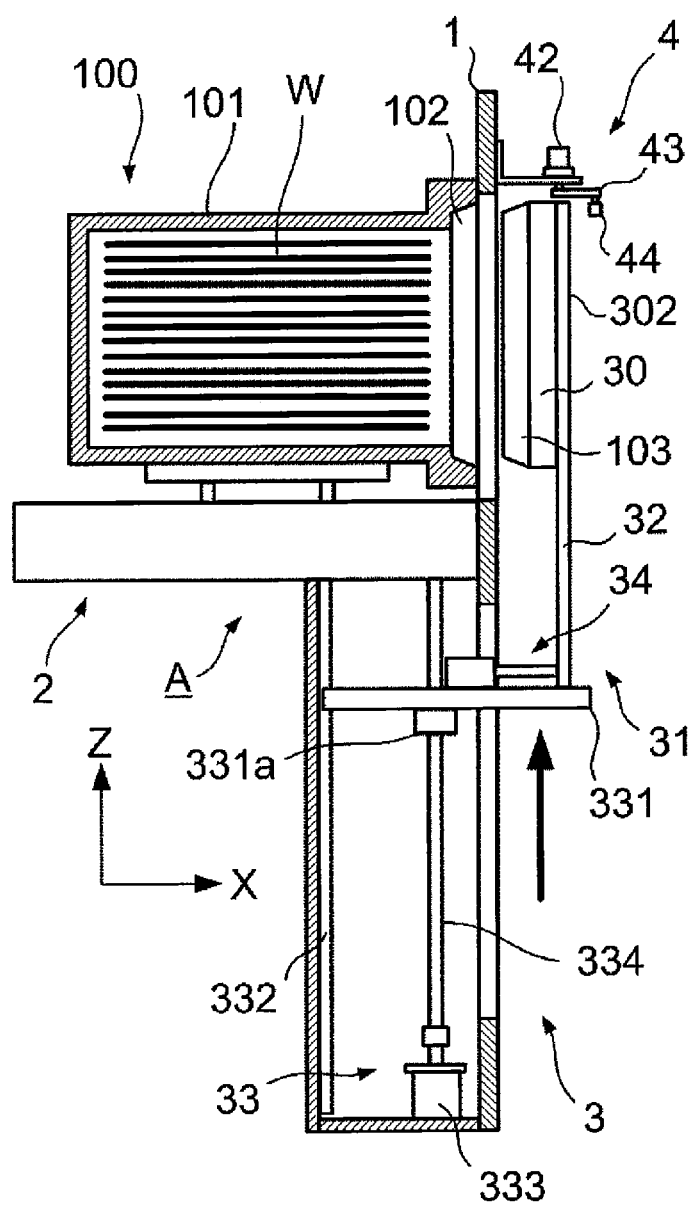

F I G. 7A
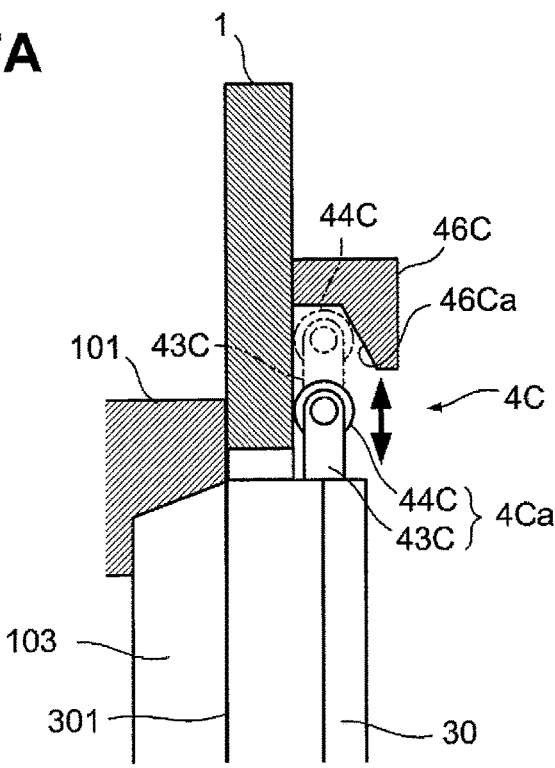
F I G. 7B
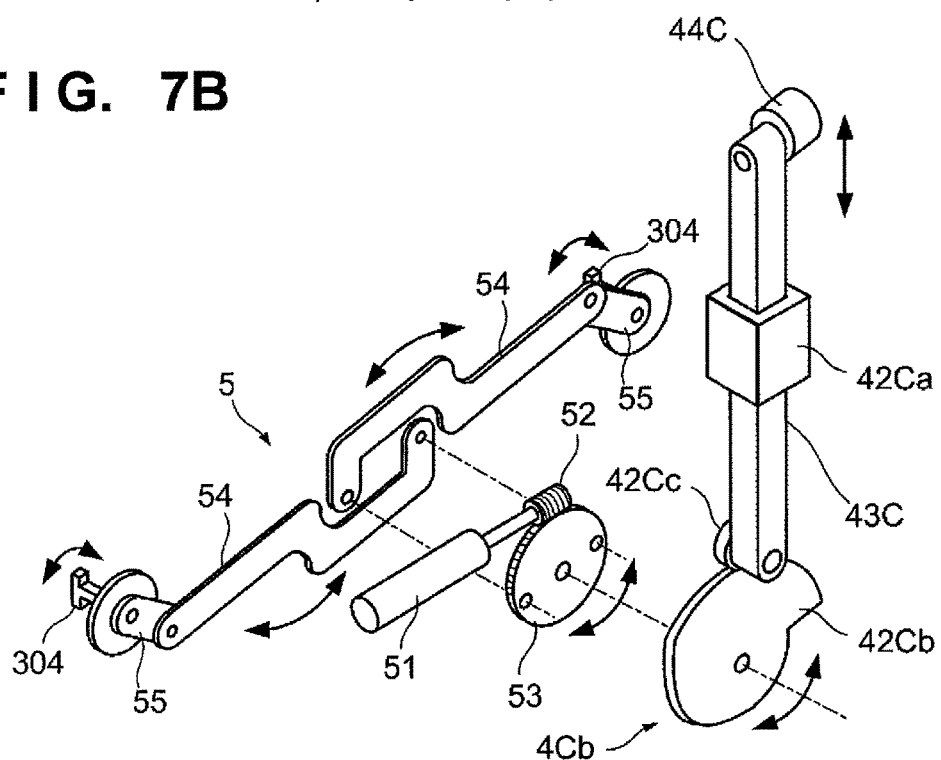

CONTAINER OPENING/CLOSING DEVICE

This application is a divisional of U.S. patent application Ser. No. 14/143,307 filed on Dec. 30, 2013, which is a continuation of International Patent Application No. PCT/JP2012/003107 filed on May 11, 2012, and claims priority to Japanese Patent Application No. 2011-150328 filed on Jul. 6, 2011. The entire content of the prior applications is incorporated herein by reference it its entirety.

BACKGROUND OF THE INVENTION

Field of the Invention

The present invention relates to a container opening/closing device for opening and closing a lid of a container.

Description of the Related Art

A wafer transporting container such as an FOUP (Front-Opening Unified Pod) or FOSB (Front Open Shipping Box) includes an opening/closing mechanism provided in a load port, and wafers are loaded into or unloaded from the container by opening and closing a door forming the lid of the container by using this opening/closing mechanism. To prevent the removal of the door and the falling of wafers inside the container from it during the transportation of the container, it is necessary to reliably close the door at the load port. Therefore, a device for checking whether the door is properly closed has been proposed (Japanese Patent Laid-Open Nos. 2008-100635, 2009-200200 and 2009-239004).

For the FOUP and FOSB, the upper limit of a force required to close the door is defined by the SEMI standards. Manufacturers of the FOUP and FOSB design them so that the door can be closed by a force not exceeding the upper limit defined by the SEMI standards. Based on the upper limit defined by the SEMI standards, therefore, a load port manufacturer designs the opening/closing mechanism so that the door can reliably be closed.

Since the sizes of wafers more and more increase, it has become necessary to close the door of a container such as the FOUP or FOSB containing wafers by using a larger force in order to fix and hold large-sized wafers. Consequently, the upper limit defined by the SEMI standards also change in accordance with the size of a wafer.

When the wafer size is 300 mm that has been the most popular size, the upper limits of the SEMI standards produce no large difference between the FOUP and FOSB. Accordingly, the load port opening/closing device is often designed based on the upper limit of the FOSB, and made usable for both the FOSB and FOUP.

When the wafer size is 450 mm, however, the upper limits of the SEMI standards have a large difference between the FOUP and FOSB. When the load port opening/closing device is designed based on the upper limit of the FOSB, the device is over-engineered for the FOUP, and the cost increases because the driving force is large. The ratio of FOUPs is generally higher than that of FOSBs as containers manufactured in a single factory. Therefore, the installation cost increases if the FOSB load port is used as the FOUP load port. By contrast, when the load port opening/closing device is designed based on the upper limit of the FOUP and used for the opening/closing of the FOSB, a door closing error may occur due to the insufficiency of the driving force.

SUMMARY OF THE INVENTION

It is an object of the present invention to provide a container opening/closing device capable of more reliably closing a lid without increasing the driving force of an opening/closing mechanism.

According to the present invention, there is provided a container opening/closing device for opening and closing a lid of a container, the container comprising a container body and the lid, the container body including an opening through which a workpiece is loaded and unloaded, the lid being detachably attached to the opening and closing the opening, the device comprising: an opening/closing mechanism which includes a holding portion for holding the lid, the opening/closing mechanism opening and closing the opening by moving the holding portion between a closing position at which the lid closes the opening, and an open position at which the lid is separated from the opening; and a pressing mechanism which presses a peripheral edge of the holding portion toward the container body when the opening/closing mechanism moves the lid from the open position to the closing position.

Further features of the present invention will become apparent from the following description of exemplary embodiments (with reference to the attached drawings).

BRIEF DESCRIPTION OF THE DRAWINGS

FIG. 5A is a view for explaining the operation of the container opening/closing device;

FIG. 7A is a view for explaining a pressing mechanism of still another embodiment;

FIG. 7B is a view for explaining a pressing mechanism of this embodiment;

DESCRIPTION OF THE EMBODIMENTS

First Embodiment

Figure 1:
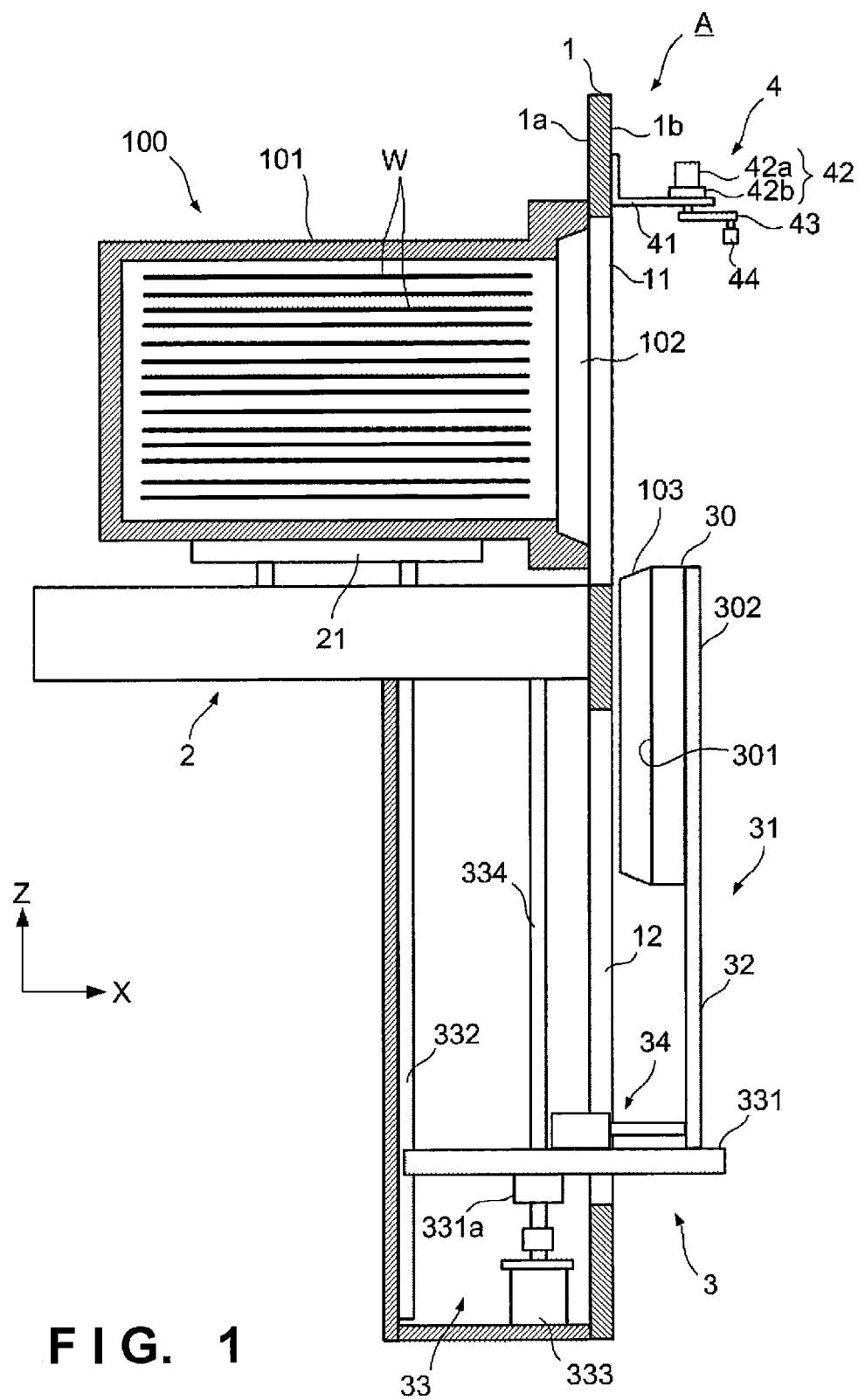
FIG. 1 is a schematic side sectional view of a container opening/closing device according to an embodiment of the present invention.

FIG. 1 is a schematic side sectional view of a container opening/closing device A according to an embodiment of the present invention. In this embodiment, the container opening/closing device of the present invention is applied to a load port for opening and closing an FOUP or FOSB. Referring to FIG. 1, Z indicates the vertical direction, and X indicates the horizontal direction.

A container 100 is an FOUP or FOSB, and includes a boxy container body 101 having on its side an opening 102 through which a wafer W as a workpiece is loaded and unloaded, and a lid (door) 103 which is detachably attached to the opening 102 and closes it. Note that FIG. 1 shows a state in which the lid 103 is opened by the container opening/closing device A and positioned in an open position.

The container opening/closing device A includes a wall member 1, mounting portion 2, opening/closing mechanism 3, and pressing mechanism 4. The wall member 1 is a plate-like member that includes a surface 1a and a surface 1b opposite to the surface 1a, and extends in the Z direction. The wall member 1 includes a hole 11 which opens in the horizontal direction and through which the lid 103 can pass, and a slit 12 for avoiding interference with the opening/closing mechanism 3.

The container body 100 is mounted on the mounting portion 2 such that the opening 102 faces the hole 11 as shown in FIG. 1, and a robot (not shown) positioned on the surface 1b side can access the wafers W in the container body 101 through the hole 11 and opening 102.

The mounting portion 2 is provided like a table on the surface 1a side with respect to the wall member 1. The mounting portion 2 has a movable dock plate 21 on which the container 100 is mounted, and the dock plate 21 is moved by a moving mechanism (not shown) in the X direction between a position (the position shown in FIG. 1) close to the hole 11 of the wall member 1, and a position far from the hole 11. The dock plate 21 is moved to the position far from the hole 11 while the container 100 is being transported, and to the position close to the hole 11 while the container 100 is being opened or closed or is kept open.

The opening/closing mechanism 3 includes a holding portion (port door) 30 for holding the lid 103, and a moving mechanism 31 that moves the holding portion 30 between a closing position at which the lid 103 closes the opening 102 and an open position (the position shown in FIG. 1) at which the lid 103 is separated from the opening 103, and opens and closes the opening 102. In this embodiment, the open position is a position at which the lid 103 has moved away from the closing position in the X direction and has moved down in the Z direction.

Figure 2A:
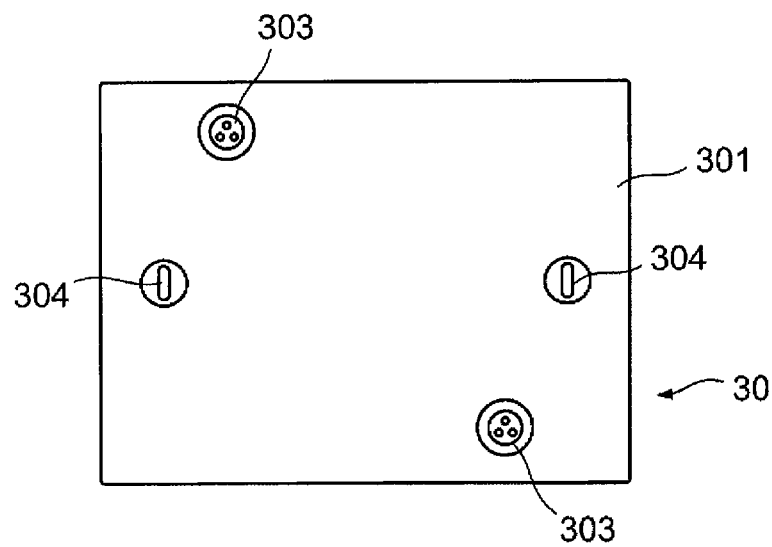
FIG. 2A is a view for explaining the holding surface of a holding portion.

The holding portion 30 includes a holding surface 301 opposing the lid 103, and a surface (to be referred to as a surface to be held hereinafter) 302 opposite to the holding surface 301. FIG. 2A is a view for explaining the holding surface 301. In this embodiment, the holding portion 30 is a rectangle, and has the same shape and size as those of the lid 103. The holding surface 301 includes suction portions 303 that detachably attach to the lid 103 by suction. The suction portions 303 are, for example, suction pads. The holding surface 301 also includes key portions 304 for operating a mechanism for engaging the container body 101 and lid 103. The key portions 304 are provided so as to engage with an engaging mechanism provided on the lid 103 in a state in which the lid 103 is held on the holding surface 301, and switch engagement and disengagement between the lid 103 and container 101 by pivotal motions.

Referring back to FIG. 1, the moving mechanism 31 includes a connecting portion 32 for connecting the moving mechanism 31 and holding portion 30, a vertical moving mechanism 33 for vertically moving the holding portion 30 through the connecting portion 32, and a horizontal moving mechanism 34 for moving the holding portion 30 in the X direction through the connecting portion 32, thereby moving the holding portion 30 back and forth with respect to the hole 11.

The connecting portion 32 has an upper portion connected to the lower portion of the holding portion 30, and a lower portion supported by a stage member 331 so as to be slidable in the X direction. In this embodiment, the horizontal moving mechanism 34 is an electric cylinder mounted on the stage member 331, and moves the holding portion 30 in the X direction through the connecting portion 32 by the horizontal movement of a rod portion of the horizontal moving mechanism 34.

The vertical moving mechanism 33 includes the stage member 331, and a rail member 332 for guiding the vertical movement of the stage member 331 by engaging with it. A ball nut 331a is rotatably attached to the stage member 331. A ball screw shaft 334 threadably engages with the ball nut 331a to form a ball screw mechanism, and also passes through the stage member 331. A motor 333 is connected to the lower end portion of the ball screw shaft 334, and rotates the ball screw shaft 334. Consequently, the stage member 331 vertically moves, so the holding portion 30 can vertically be moved in the Z direction through the connecting portion 32.

Figure 2B:
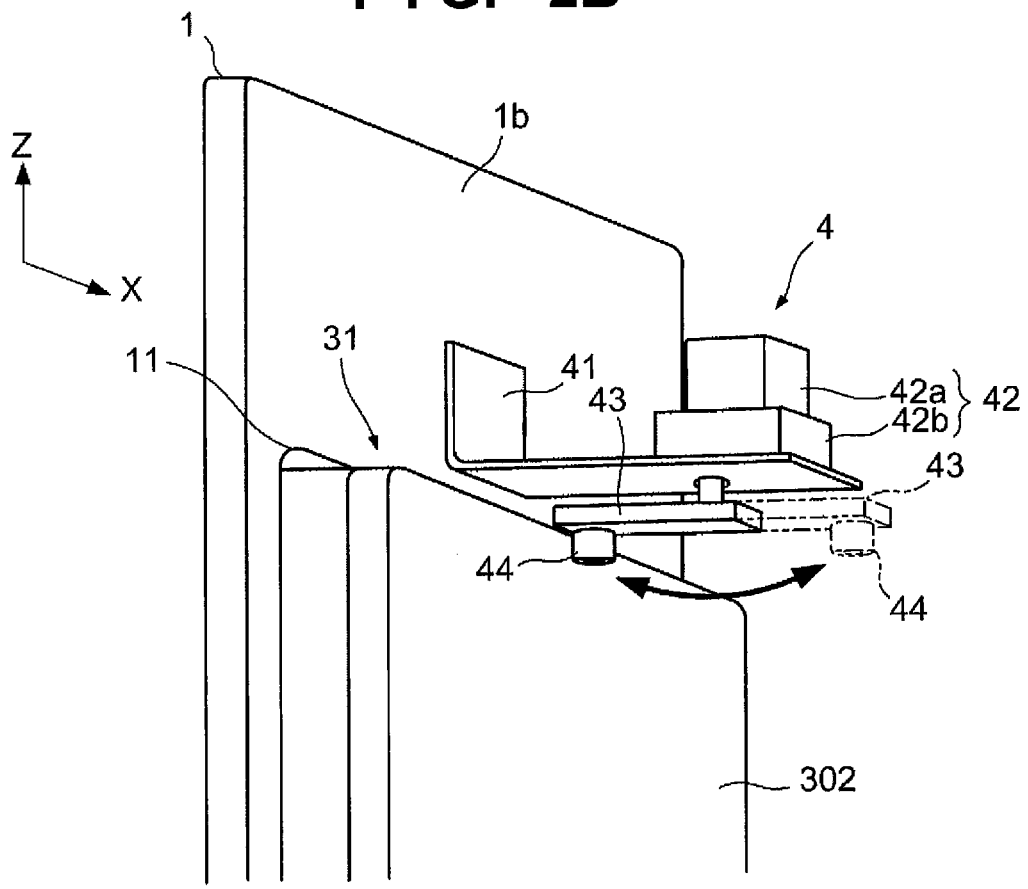
FIG. 2B is a view for explaining the operation of a pressing mechanism.

Referring to FIGS. 1 and 2B, the pressing mechanism 4 is a mechanism for pressing the peripheral edge of the holding portion 30 toward the container body 101 when the opening/closing mechanism 3 moves the lid 103 from the open position to the closing position. In this embodiment, the pressing mechanism 4 includes an L-shaped bracket 41, a driving unit 42 supported by the bracket 41, an arm member 43 that is connected to the driving unit 42 and pivots on a horizontal plane, and a pressing portion 44 supported by the arm member 43.

The driving unit 42 includes a driving source 42a such as a motor, and a speed reducer 42b for reducing the output from the driving source 42a. One end portion of the arm member 43 is attached to the output shaft of the speed reducer 42b. The driving force of the driving source 42a pivots the arm member 43, thereby giving a pressing driving force to the pressing portion 44. In this embodiment, the pressing portion 44 is a roller member, and rotatably attached to the other end portion of the arm member 43.

The pressing portion 44 is positioned on the peripheral edge of the hole 11 on the surface 1b side of the wall member 1, and moves, by the pivotal motion of the arm member 43, between a standby position indicated by the alternate long and two short dashed lines in FIG. 2B and a pressing position indicated by the solid lines in FIG. 2B. Since the pressing portion 44 is positioned on the peripheral edge of the hole 11, it is possible to prevent interference between the pressing portion 44 and a robot (not shown) for loading and unloading the wafer W.

During the process of moving from the standby position to the pressing position, the pressing portion 44 presses the upper peripheral edge of the surface 302 to be held of the holding portion 30. Consequently, the upper edge of the lid 103 held by the holding portion 30 is also pressed toward the container body 101, and this makes the closing more reliable.

Note that it is also possible to install a position sensor for sensing whether the pressing portion 44 is in the standby position or pressing position. An example of this position sensor is a photosensor (photointerrupter) for sensing a piece to be sensed provided on the arm member 43, and the sensor can be supported by the bracket 41.

Figure 3:
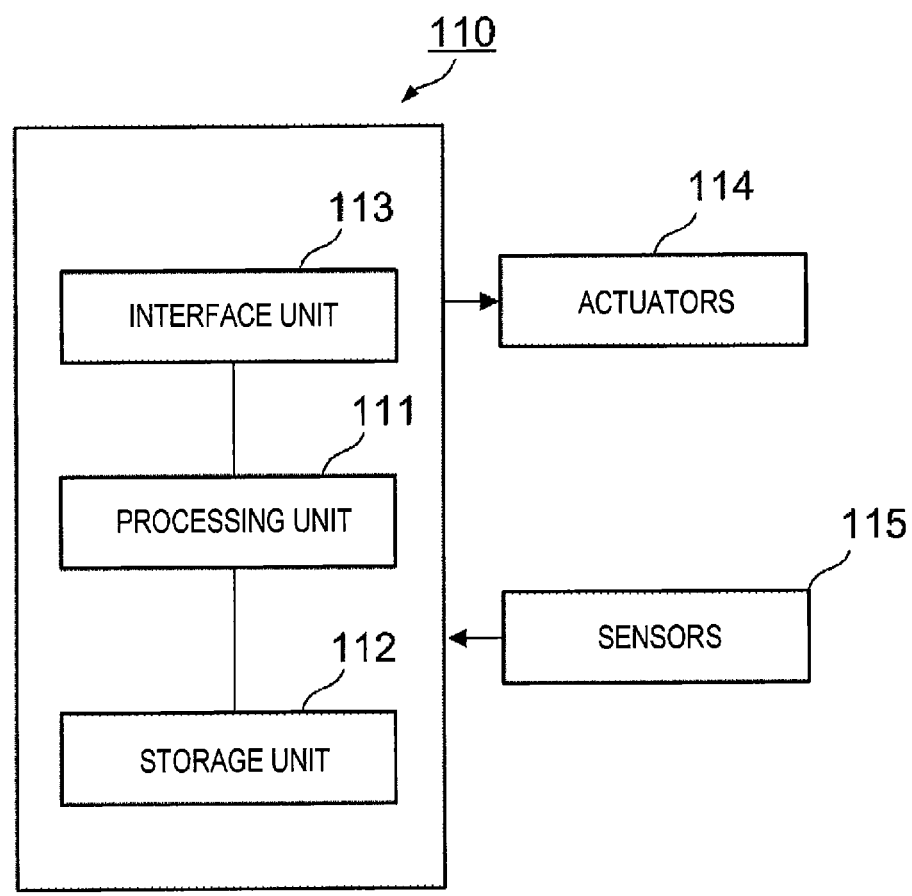
FIG. 3 is a block diagram of a controller.

FIG. 3 is a block diagram of a controller 110 of the container opening/closing device A. The controller 110 includes a processing unit 111 such as a CPU, a storage unit 112 such as a RAM or ROM, and an interface unit 113 for interfacing an external device and the processing unit 111. The interface unit 113 includes a communication interface for communicating with a higher-rank computer such as a host computer (not shown) or a peripheral device (not shown).

The processing unit 111 executes a program stored in the storage unit 112, and controls various actuators 114 based on sensing results from various sensors 115 or an instruction from the host computer. The various sensors 115 include a position sensor of the pressing portion 44, Z- and X-direction position sensors of the holding portion 30, a position sensor of the dock plate 21, and a presence/absence sensor of the container 100.

Figure 4:
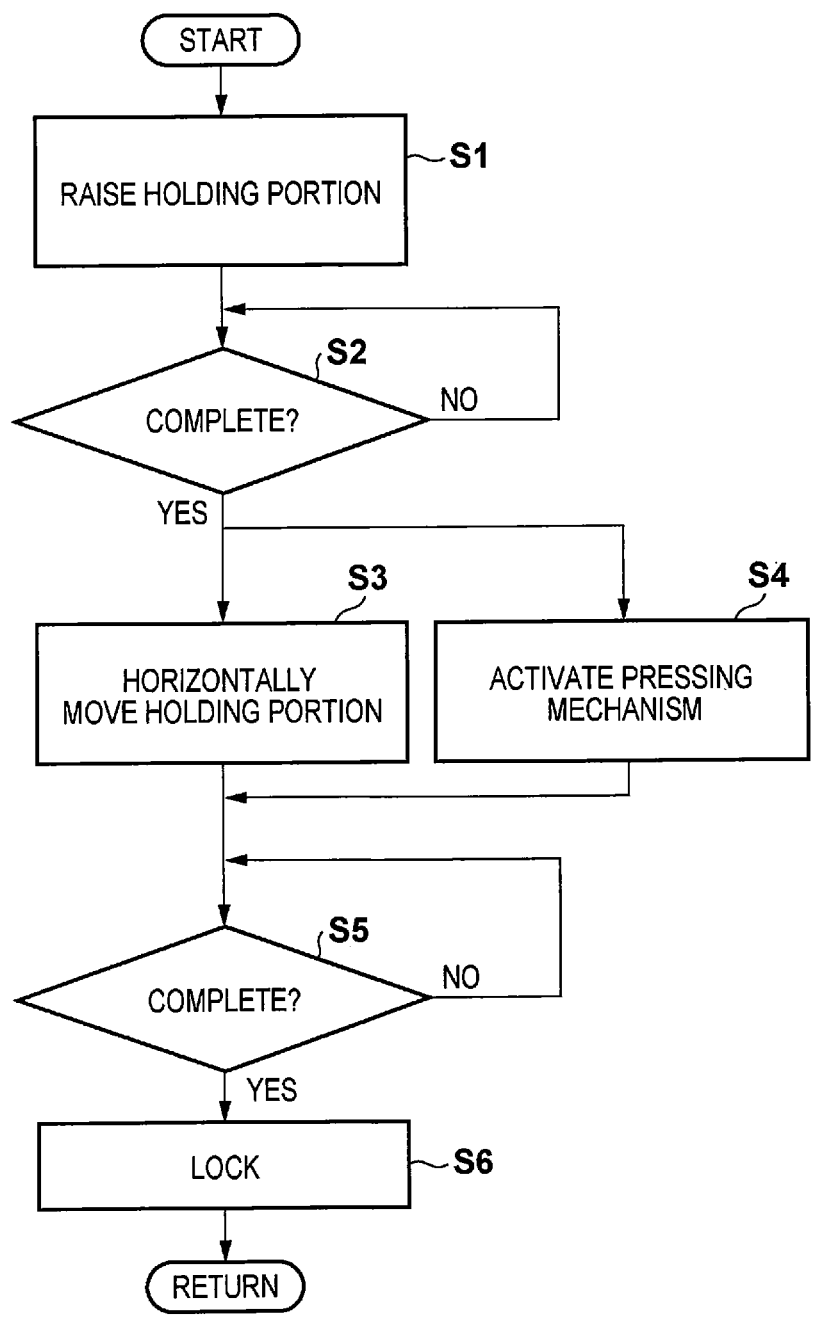
FIG. 4 is a flowchart showing an example of control to be executed by the controller.
Figure 5B:
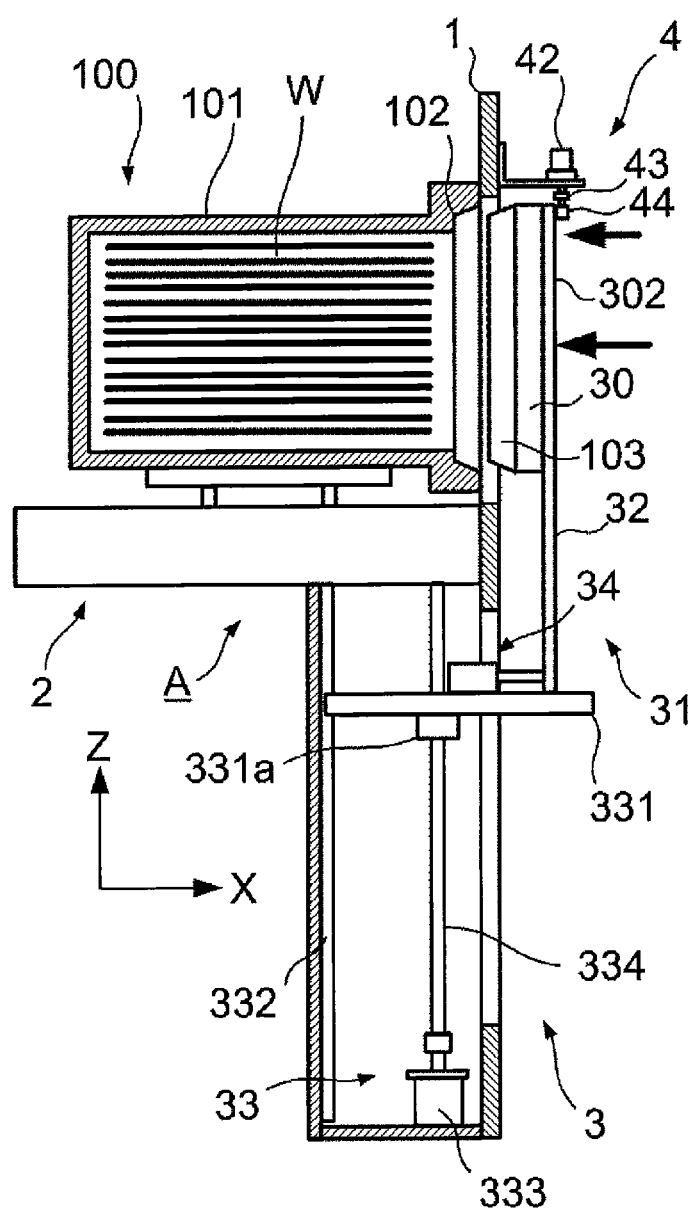
FIG. 5B is a view for explaining the operation of the container opening/closing device.
Figure 5C:
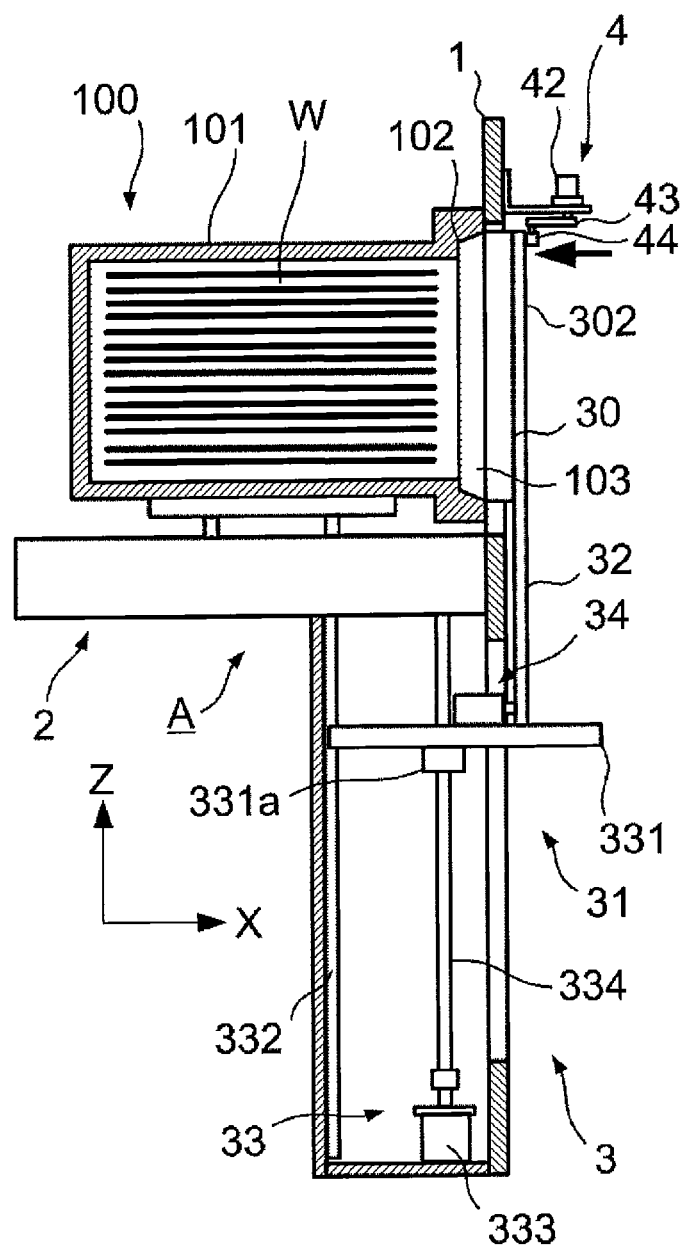
FIG. 5C is a view for explaining the operation of the container opening/closing device.

The actuators 114 include the driving source 42a, the motor 333, the horizontal moving mechanism (DC motor (servo motor)) 34, a driving source of the moving mechanism of the dock plate 21, and a driving source of the mechanism of pivoting the key portions 304. Especially when moving the holding portion 30 from the open position to the closing position, the processing unit 111 synchronizes the movement of the lid 103 by the moving mechanism 31 with the pressing on the holding portion 30 by the pressing portion 44, thereby closing the lid 103 more reliably. An example of this control will be explained below with reference to FIGS. 4 and 5A to 5C. FIG. 4 is a flowchart of an example of control to be executed by the controller 110 when closing the lid 103. FIGS. 5A to 5C are views for explaining the operation of the container opening/closing device A.

When moving the holding portion 30 shown in FIG. 1 from the open position to the closing position, the processing unit 111 first performs control for raising the holding portion 30 while the pressing portion 44 is positioned in the standby position (step S1 in FIG. 4). More specifically, the processing unit 111 causes the vertical moving mechanism 33 to raise the stage member 331, thereby raising the holding portion 30 to a height at which the lid 103 opposes the opening 102 of the container body 101, as shown in FIG. 5A. The processing unit 111 obtains the sensing result from the Z-direction position sensor of the holding portion 30, and checks whether the rise of the holding portion 30 is complete (step S2 in FIG. 4). If the completion is confirmed, the processing unit 111 stops the vertical moving mechanism 33, and advances to processes in steps S3 and S4 of FIG. 4. Note that if the completion of the rise of the holding portion 30 cannot be confirmed within a predetermined time, error processing or the like is perprovided.

Then, in step S3, the processing unit 111 causes the horizontal moving mechanism 34 to move the holding portion 30 in the X direction (toward the container body 101) and move the holding portion 30 to the closing position, thereby closing the opening 102 with the lid 103. In step S4, the processing unit 111 drives the driving unit 42 of the pressing mechanism 4 in synchronism with the driving of the actuator of the horizontal moving mechanism 34. By this synchronized driving (or almost synchronized driving), the arm member 43 pivots, and the pressing portion 44 abuts against the surface 302 to be held of the holding portion 30. By thus driving the horizontal moving mechanism 34 while the pressing portion 44 is pressing (supporting) the surface 302 to be held, the holding portion 30 and lid 103 are moved to the closing position as they are kept vertical, as shown in FIG. 5B.

The processing unit 111 obtains the sensing results from the X-direction position sensor of the holding portion 30 and the position sensor of the pressing portion 44, and checks whether the movement of the holding portion 30 to the closing position is complete (step S5 in FIG. 4). If this is confirmed, the processing unit 111 stops the horizontal moving mechanism 34 and driving unit 42, and advances to a process in step S6 of FIG. 4. Note that if this cannot be confirmed within a predetermined time, error processing or the like is performed.

When the arm member 43 completely pivots (through, for example, 180°) in the pressing mechanism 4 and the pressing portion 44 moves to the pressing position as shown in FIG. 5C, the lid 103, particularly, the upper portion of the lid 103 is pressed toward the container body 101, so the lid 103 more reliably closes the opening 102.

In step S6 of FIG. 4, the processing unit 111 drives the driving source of the mechanism for pivoting the key portions 304, thereby pivoting the key portions 304 and engaging the lid 103 with the container body 101. Consequently, the lid 103 and container body 101 are locked. Thus, the processing of one unit is complete.

Note that a procedure of moving the holding portion 30 from the closing position to the open position in order to open the opening 102 is, of course, the reverse of the above-mentioned procedure. Note also that the pressing mechanism 4 may also be driven after the movement of the lid 103 to the closing position is complete, instead of performing this driving in synchronism with the movement of the holding portion 30.

In the embodiment as described above, the lid 103 can be closed more reliably by using the pressing mechanism 4. More specifically, since the holding portion 30 and lid 103 are moved to the closing position as they are held vertical, it is possible to avoid the occurrence of a state in which only one side of the lid 103 is closed and the other side is kept unclosed. That is, the lid 103 is closed as it is held upright, and this reduces the possibility of the occurrence of a lid closing error. In this embodiment, the horizontal moving force of the whole lid 103 is not increased by increasing the driving force of the opening/closing mechanism 3, and the pressing mechanism 4 locally presses the peripheral edge of the holding portion 30. This can prevent an increase in cost. For example, even when the driving force of the moving mechanism 31 (especially the horizontal moving mechanism 34) is set for an FOUP, the device can be used as a container opening/closing device for an FOSB because the pressing mechanism 4 is provided.

Also, the pressing mechanism 4 is fixed to the wall member 1 through the bracket 41. This facilitates, for example, selectively installing the pressing mechanism 4 in the container opening/closing device A for an FOSB, and not installing the pressing mechanism 4 in the container opening/closing device A for an FOUP.

In this embodiment, the pressing portion 44 presses the upper peripheral edge of the holding portion 30. However, a portion to be pressed is not limited to this portion, and it is also possible to press the left peripheral edge and/or the right peripheral edge of the holding portion 30.

In this embodiment, however, the lower portion of the holding portion 30 is connected to the moving mechanism 31. This sometimes weakens the pressing force in the upper portion of the holding portion 30, and may make the closing of the lid 103 insufficient in the upper portion of the lid 103. Accordingly, a closing error can reliably be avoided with a smaller pressing force by using the arrangement in which the pressing portion 44 presses the upper peripheral edge of the holding portion 30.

Furthermore, the pressing mechanism 4 presses one portion in this embodiment, but it is also possible to press a plurality of portions of the holding portion 30. In this case, it is possible to use the same driving unit 42 or different driving units.

Second Embodiment

Figure 6A:
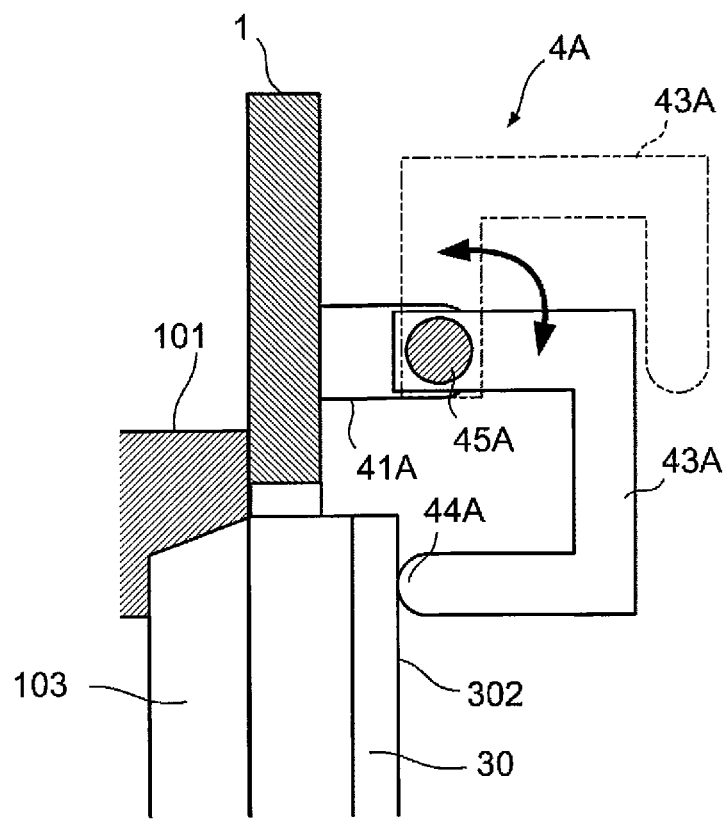
FIG. 6A is a view for explaining a pressing mechanism of another embodiment.

In the above-mentioned first embodiment, the pressing portion 44 is moved between the standby position and pressing position as it is pivoted on a horizontal plane. However, the pressing portion 44 may also be pivoted on a vertical plane. FIG. 6A shows an example.

A pressing mechanism 4A shown in FIG. 6A includes a bracket 41A for axially supporting a driving shaft 45A fixed to a wall member 1, and a U-shaped arm member 43A connected to the driving shaft 45A, and a distal end portion of the arm member 43A, which is not connected to the driving shaft 45A, forms a pressing portion 44A. The driving shaft 45A is extended in the horizontal direction, and pivoted by a driving unit (not shown). Like the driving unit 42 in the first embodiment, this driving unit is driven in synchronism with the driving of an actuator of a horizontal moving mechanism 34. When the driving shaft 45A is pivoted, the arm member 43A pivots between a standby position indicated by the alternate long and two short dashed lines and a pressing position indicated by the solid lines, and the pressing portion 44A pivots on a vertical plane (the X-Z plane). Examples of the driving unit are a servo motor and rotary cylinder.

Third Embodiment

Figure 6B:
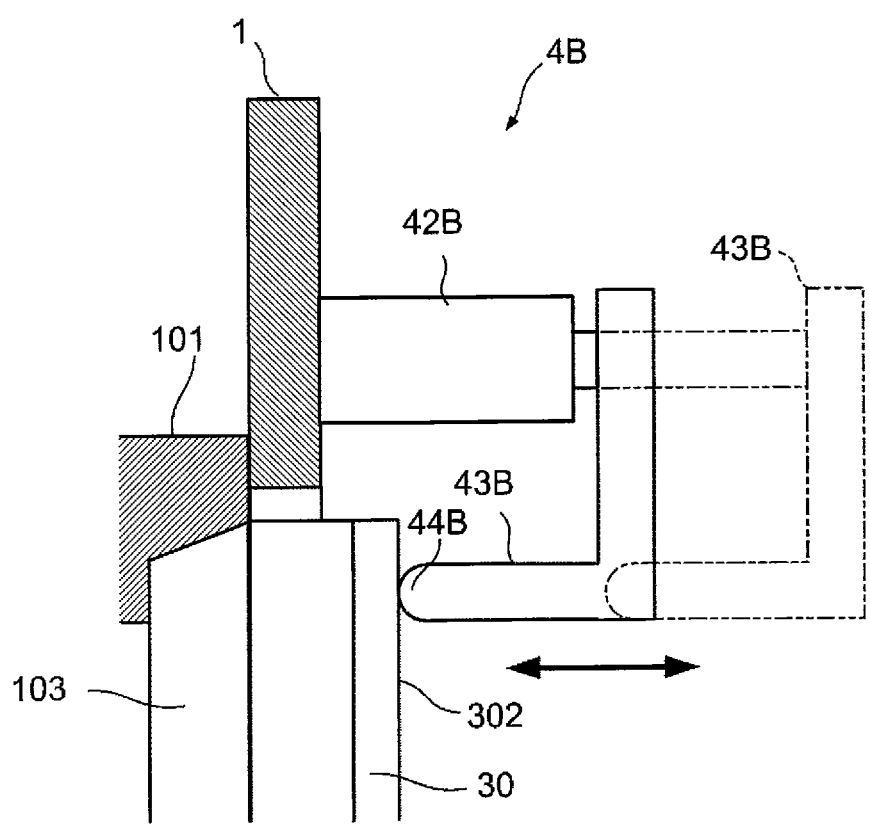
FIG. 6B is a view for explaining a pressing mechanism of still another embodiment.

The pressing portions 44 and 44A are pivoted in the above-mentioned first and second embodiments, but they may also be translated. FIG. 6B shows an example.

A pressing mechanism 4B shown in FIG. 6B includes an actuator 42B supported on a wall member 1, and an arm member 43B. The actuator 42B is, for example, an electric cylinder or air cylinder, and moves the arm member 43B in a direction (the X direction) indicated by the arrows. Like the driving unit 42 in the first embodiment, the actuator 42B is driven in synchronism with the driving of an actuator of a horizontal moving mechanism 34. The distal end portion of the arm member 43B forms a pressing portion 44B. When the actuator 42B is driven, the arm member 43B moves back and forth between a standby position indicated by the alternate long and two short dashed lines and a pressing position indicated by the solid lines, and the pressing portion 44B presses a surface 302 to be held of a holding portion 30. Other examples of the driving unit are an electric cylinder, air cylinder, ball screw, and rotary cylinder.

Fourth Embodiment

Another example of the pressing mechanism will further be explained. A pressing mechanism 4C shown in FIG. 7A includes a projecting portion 4Ca, and a guide portion 46C provided on a wall member 1. In this embodiment, a counterforce that moves a holding portion 30 toward a container body 101 is given to the projecting portion 4Ca by abutting it against a cam surface 46Ca of the guide portion 46C, thereby pressing the upper peripheral edge of the holding portion 30.

A driving mechanism installed inside the holding portion 30 moves the projecting portion 4Ca in a direction (the Z direction) parallel to the surface direction of a holding surface 301, and the projecting portion 4Ca projects from the holding portion 30. This driving mechanism will be explained with reference to FIG. 7B.

A lock mechanism 5 actuates a driving mechanism 4Cb. The lock mechanism 5 pivots key portions 304, and switches engagement and disengagement between a lid 103 and the container body 101. First, the arrangement of the lock mechanism 5 will be explained.

The lock mechanism 5 includes a motor 51 as a driving source. A worm is attached to the output shaft of the motor 51, and forms a worm gear by meshing with a worm wheel 53. The worm wheel 53 is connected to link members 54 in a position eccentric from the rotational center. The key portions 304 are respectively connected to the link members 54. Whenever the motor 51 rotates the worm wheel 53 through 180°, therefore, the key portions 304 pivot 90° to switch engagement and disengagement between the lid 103 and container body 101.

In this embodiment, the projecting portion 4Ca includes a pressing bar 43C extending in a direction parallel to the surface direction of the holding surface 301, and a cam follower 44C axially supported by the upper end portion of the pressing bar 43C so as to be rotatable.

The driving mechanism 4Cb includes a guide member 42Ca for guiding the movement of the pressing bar 43C in the Z direction, and a cam mechanism provided on the lower end portion of the pressing bar 43C. The guide member 42Ca is fixed to the holding portion 30. The cam mechanism includes a plate cam 42Cb and cam follower 42Cc. The plate cam 42Cb is concentrically connected to the worm wheel 53 and rotates in synchronism with the rotation of the worm wheel 53, and a cam surface is provided on the circumferential surface of the plate cam 42Cb. The cam follower 42Cc is axially supported by the lower end portion of the pressing bar 43C so as to be rotatable, and abutted against the cam surface of the plate cam 42Cb.

The plate cam 42Cb has a portion in which the distance from the rotation center to the cam surface continuously changes, and can move, by using this portion, the pressing bar 43C in the Z direction by the rotation of the plate cam 42Cb.

Note that the cam mechanism using the plate cam 42Cb actuates the projecting portion 4Ca in this embodiment, but a cam mechanism of another kind may also be used, and it is also possible to move the projecting portion 4Ca by using a mechanism other than the cam mechanism.

Since the lock mechanism 5 actuates the driving mechanism 4Cb, the pressing mechanism 4C can perform pressing and can release pressing in synchronism with engagement and disengagement between the lid 103 and container body 101. An operation example will be explained below with reference to FIGS. 8A, 8B, 9A, and 9B.

Figure 8A:
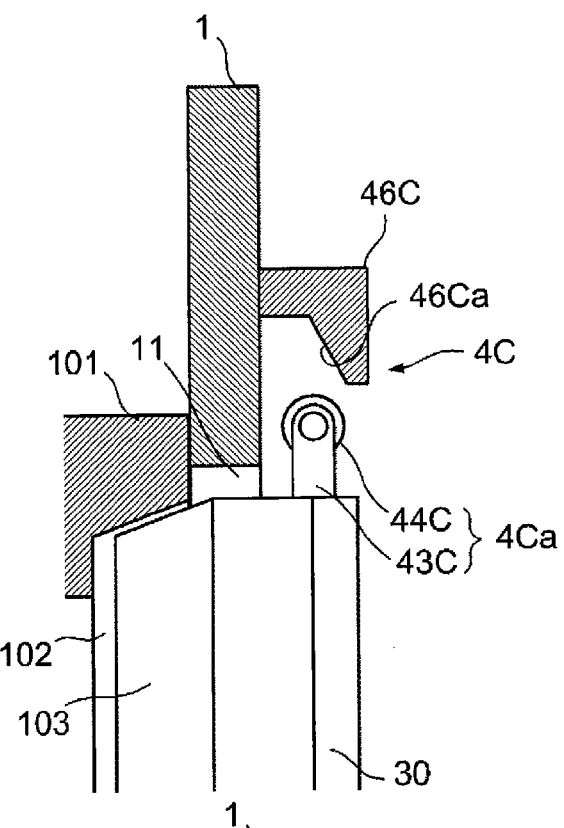
FIG. 8A is a view for explaining a pressing mechanism of this embodiment.

FIG. 8A shows a state in which the holding portion 30 is positioned in the closing position by an opening/closing mechanism 3. FIG. 8A exaggerates the degree that an opening 102 is insufficiently closed by the lid 103. The projecting portion 4Ca is positioned in the standby position far from the guide portion 46C.

Figure 8B:
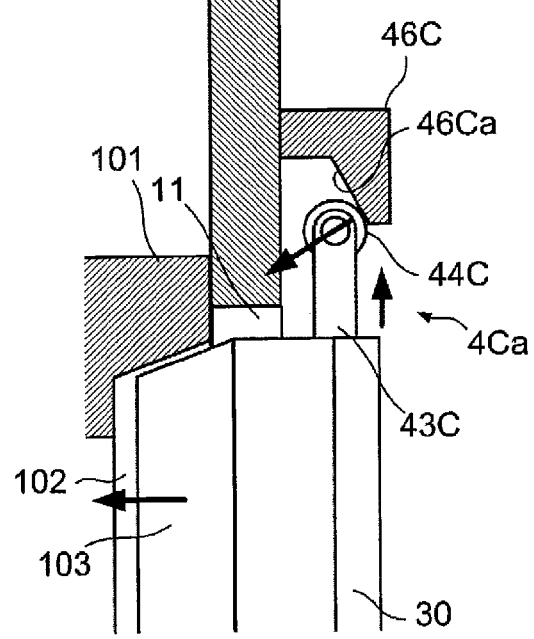
FIG. 8B is a view for explaining a pressing mechanism of this embodiment.

The motor 51 of the lock mechanism 5 is driven from the state shown in FIG. 8A, and the key portions 304 start switching the engagement state between the lid 103 and container body 101 from disengagement to engagement. Since the motor 51 is driven, the driving mechanism 4Cb also operates to raise the projecting portion 4Ca. FIG. 8B shows a state in which the projecting portion 4Ca is rising. The cam follower 44C abuts against the cam surface 46Ca of the guide portion 46C, and receives a counterforce in a direction normal to the cam surface 46Ca. This counterforce is transmitted to the body of the holding portion 30 through the guide member 42Ca, and moves the holding portion 30 (particularly its upper edge) toward the container body 101. The cam surface 46Ca forms an inclined surface inclining from a vertical plane so that the direction normal to the cam surface 46Ca is directed to the downward direction in the direction of the container body 101, and guides the cam follower 44C so that the holding portion 30 moves toward the container body 101.

Figure 9A:
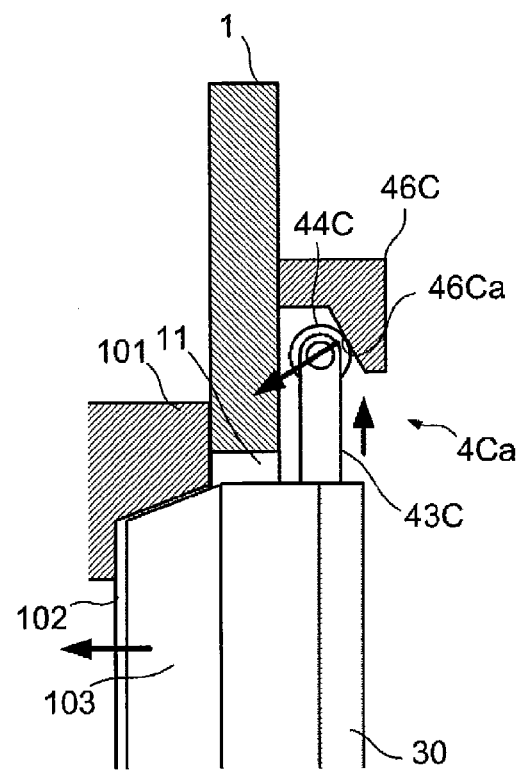
FIG. 9A is a view for explaining a pressing mechanism of this embodiment.
Figure 9B:
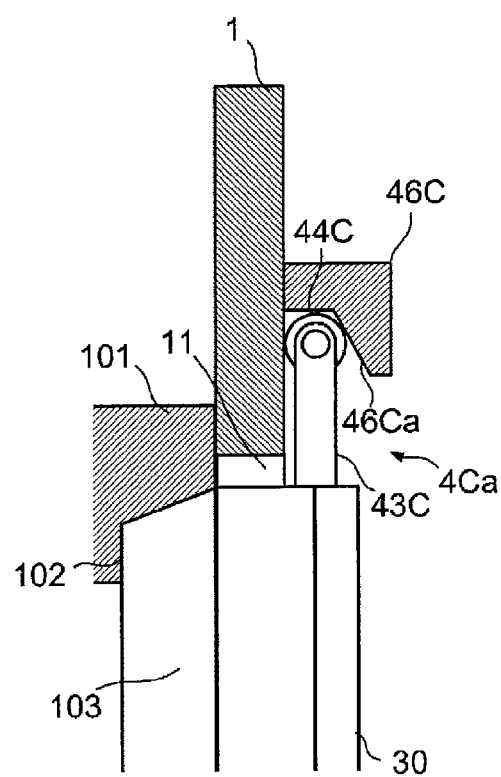
FIG. 9B is a view for explaining a pressing mechanism of this embodiment.

FIG. 9A shows a state in which the rise of the projecting portion 4Ca has advanced. The holding portion 30 has moved toward the container body 101. FIG. 9B shows a state in which the rise of the projecting portion 4Ca is complete. In this state, the holding portion 30 is in a position closest to the container body 101, and the lid 103 is in a position where the opening 102 is completely closed. Conversely, the shapes and moving amounts of the cam surface 46Ca and projecting portion 4Ca are designed so that the lid 103 is in the position where the opening 102 is completely closed. Also, the cam surface of the plate cam 42Cb is designed such that the rise of the projecting portion 4Ca is complete before the key portions 304 complete the switching from the disengaged state to the engaged state between the lid 103 and container body 101.

In this embodiment, it is thus possible to reliably close the lid 103. Also, in this embodiment, the pressing mechanism 4C is operated by using the driving force of the lock mechanism 5. Since no new additional actuator is necessary, an increase in cost can be reduced. Note that the pressing mechanism 4C is provided near the upper edge portion of the holding portion 30 in this embodiment, but the pressing mechanism 4C may also be provided near the side edge portion, and it is also possible to form a plurality of mechanisms.

Furthermore, this embodiment has been explained by taking an example using the actuator of the lock mechanism 5, but the present invention is not limited to this. For example, the projecting portion 4Ca may also be raised by operating the driving mechanism 4Cb by using another actuator. In this case, it is possible to use an electric cylinder or the like instead of the cam mechanism.

Fifth Embodiment

Another example of the pressing mechanism will be explained with reference to FIGS. 10A and 10B. A pressing mechanism 4D shown in FIG. 10A includes a projecting portion 43D obliquely projecting from the upper portion of a holding portion 30 toward its back surface side (a side opposite to a container body 101), and an engaging portion 46D provided on a wall member 1. Note that the holding portion 30 is positioned in an open position in FIG. 10A.

In this embodiment, a connecting portion 32 has a hinge 321, and supports the holding portion 30 so that it can incline toward the wall member 1 within a predetermined range. A maximum inclination angle of the holding portion 30 can also physically be regulated by the arrangement (for example, a stopper) of the hinge 321. Also, the holding portion 30 can be inclined by the hinge 321 in this embodiment, but the holding portion 30 can also elastically be inclined by an elastic member (for example, a leaf spring).

In this embodiment, the projecting portion 43D is a rod-like member, and a cam follower 43D1 is provided at the distal end portion of the projecting portion 43D. The projecting portion 43D is fixed to the holding portion 30. The projecting portion 43D is preferably made of a highly rigid material such as a metal material. The projecting portion 43D may also be provided to freely incline toward the back surface side. In this case, it is favorable to form a stopper that defines an inclination limit to the back surface. In addition, it is also possible to form the projecting portion 43D by using a flexible material, and allow the projecting portion 43D to freely bend toward the back surface.

The engaging portion 46D is provided above a hole 11 in a surface 1b of the wall member 1. In this embodiment, the engaging portion 46D has an opening (groove) that opens downward so that the distal end portion of the projecting portion 43D can be inserted and removed. The engaging portion 46D can have any shape as long as the distal end portion of the projecting portion 43D can be inserted and removed and can be engaged.

Next, a pressing operation performed by the pressing mechanism 4D of this embodiment will be explained. From the state shown in FIG. 10A in which the holding portion 30 is in the open position, a vertical moving mechanism 33 first raises a stage member 331. The holding portion 30 rises as it inclines toward the wall member 1.

Figure 10A:
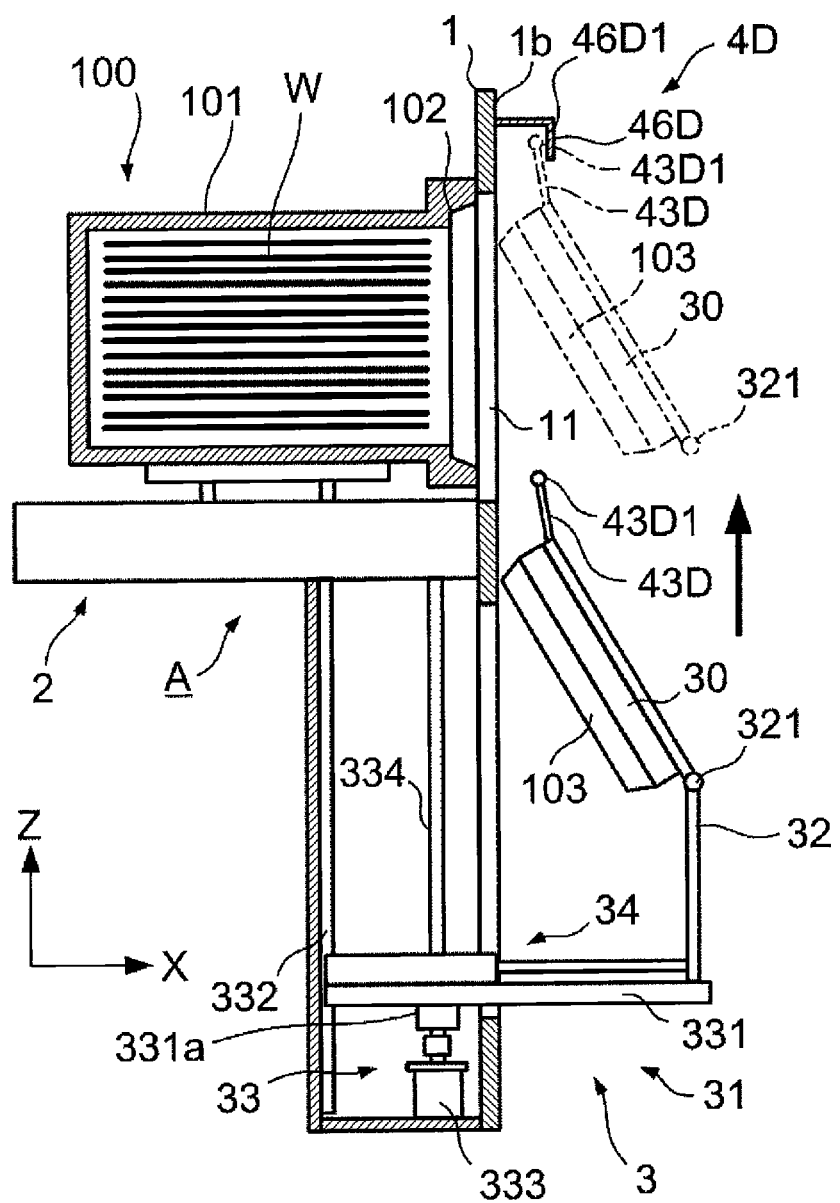
FIG. 10A is a view for explaining a pressing mechanism of still another embodiment.
Figure 10B:
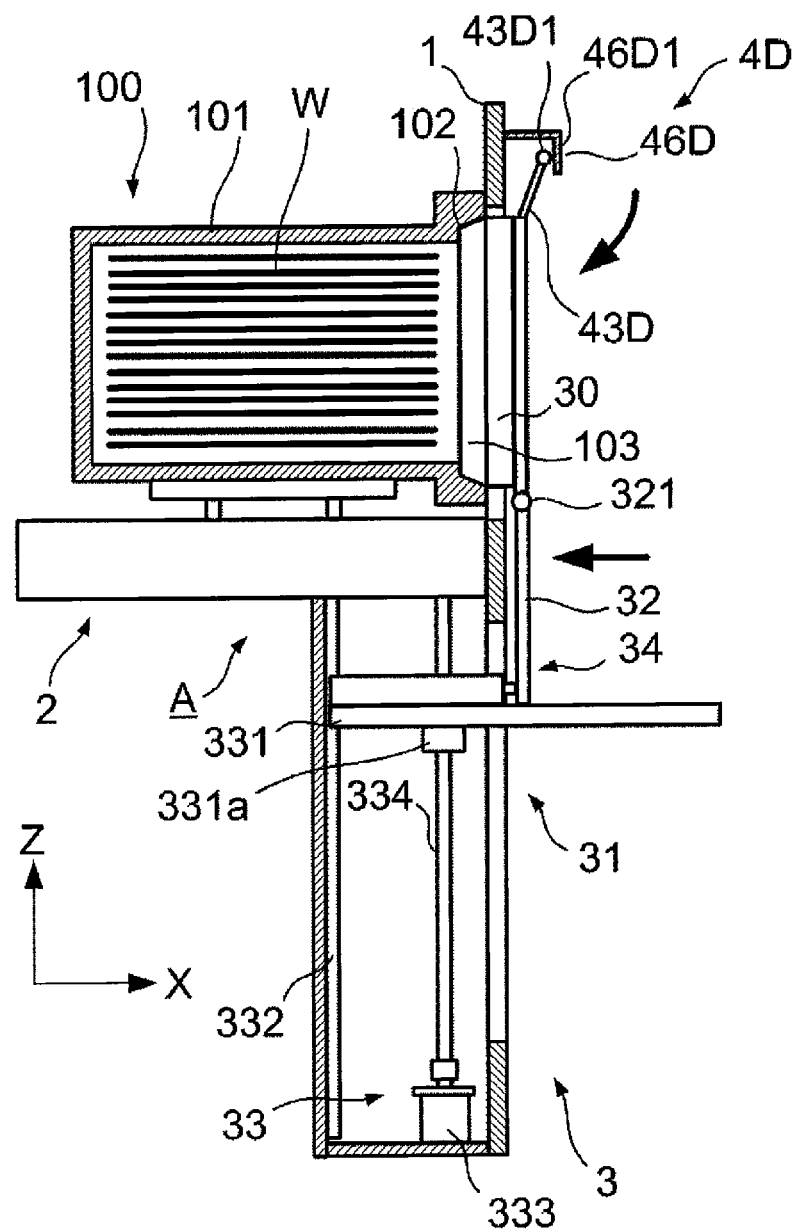
FIG. 10B is a view for explaining a pressing mechanism of this embodiment.

The holding portion 30 rises to a position where it opposes the hole 11 as indicated by the alternate long and two short dashed lines in FIG. 10A, and the cam follower 43D1 of the projecting portion 43D is inserted into the engaging portion 46D. In this stage, the cam follower 43D1 does not abut against an inner wall 46D1 of the engaging portion 46D. Then, a horizontal moving mechanism 34 is driven to move the holding portion 30 in the X direction toward a closing position. Consequently, the upper portion of the lid 103 deeply enters the opening 102, and subsequently the lower portion of the lid 103 enters the opening 102. As the lower portion of the lid 103 starts entering the opening 102 and the holding portion 30 becomes close to a vertical state, the projecting portion 43D inclines toward the back surface. Accordingly, the cam follower 43D1 abuts against the inner wall 46D1 of the engaging portion 46D, and the projecting portion 43D and engaging portion 46D are completely engaged.

After that, the projecting portion 43D functions as a bearer bar, and the pressing force from the projecting portion 43D regulates the upper portion of the holding portion 30 from moving in a direction away from the hole 11.

As a consequence, it is possible to guide the upper portion of the holding portion 30 to the position where the opening 102 is more reliably closed. In addition, as shown in FIG. 10B, the inclining holding portion 30 stands up, so the whole holding portion 30 closes the opening 102.

In this embodiment as described above, the lid 103 can be closed more reliably by using the pressing mechanism 4D. In this embodiment, an increase in cost can be reduced because the pressing mechanism 4D itself does not have its own driving source. Note that it is also possible to form a plurality of projecting portions 43D in the widthwise direction of the holding portion 30.

The present invention is not limited to the above-described embodiments, and various changes and modifications can be made within the spirit and scope of the present invention. Therefore, to apprise the public of the scope of the present invention, the following claims are made.

What is claimed is:

1. A container opening/closing device for opening and closing a lid of a container, the container comprising a container body and the lid, the container body including an opening through which a workpiece is loaded and unloaded, the lid being detachably attached to the opening and closing the opening, said device comprising:
- an opening/closing mechanism which includes a holding portion for holding said lid, said opening/closing mechanism opening and closing the opening by moving said holding portion between a closing position at which said lid closes the opening, and an open position at which said lid is separated from the opening;
- a pressing mechanism which presses a peripheral edge of said holding portion toward said container body when said opening/closing mechanism moves said lid from the open position to the closing position;
- a wall member extending in a vertical direction and including a hole which opens in a horizontal direction and through which said lid can pass; and
- a lock mechanism which is provided in said holding portion and switches engagement and disengagement between said lid and said container body, wherein said holding portion includes a holding surface opposing said lid, and said pressing mechanism comprises:
- a projecting portion which moves in a direction parallel to a surface direction of said holding surface, and projects from said holding portion;
- a driving mechanism which is operated by said lock mechanism and moves said projecting portion; and
- a guide portion which is provided on said wall member, and, when said projecting portion abuts against said guide portion, gives said projecting portion a counter-force for moving said holding portion toward said container body.

2. The container opening/closing device according to claim 1, wherein said projecting portion comprises:
- a pressing bar extending in a direction parallel to a surface direction of said holding surface; and
- a cam follower which is provided at one end of said pressing bar and abuts against said guide portion, said driving mechanism comprises a cam mechanism which is provided at the other end of said pressing bar and actuated by said lock mechanism, and said guide portion comprises a guide member provided on said wall member and including a cam surface which guides said cam follower such that said holding portion moves toward said container.

3. The container opening/closing device according to claim 2, wherein said cam mechanism comprises:
- a plate cam to be actuated by said lock mechanism; and
- a cam follower which is provided at the other end of said pressing bar and abuts against said plate cam.

* * * * *